(12) United States Patent
Millward et al.

(10) Patent No.: US 10,629,671 B2
(45) Date of Patent: *Apr. 21, 2020

(54) METHODS OF FORMING SEMICONDUCTOR DEVICE STRUCTURES, AND METHODS OF FORMING CAPACITOR STRUCTURES

(71) Applicant: Micron Technology, Inc., Boise, ID (US)

(72) Inventors: Dan B. Millward, Boise, ID (US); J. Neil Greeley, Boise, ID (US)

(73) Assignee: Micron Techonology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/108,788

(22) Filed: Aug. 22, 2018

(65) Prior Publication Data

US 2018/0366538 A1 Dec. 20, 2018

Related U.S. Application Data

(63) Continuation of application No. 14/065,662, filed on Oct. 29, 2013, now Pat. No. 10,090,376.

(51) Int. Cl.
*H01L 21/02* (2006.01)
*H01L 21/311* (2006.01)
(Continued)

(52) U.S. Cl.
CPC .......... *H01L 28/40* (2013.01); *H01L 21/0206* (2013.01); *H01L 21/02057* (2013.01);
(Continued)

(58) Field of Classification Search
None
See application file for complete search history.

(56) References Cited

U.S. PATENT DOCUMENTS 4,501,828 A 2/1985 Hadermann et al.
7,125,781 B2 10/2006 Manning et al.
(Continued)

OTHER PUBLICATIONS

World Health Organization, "Gamma-butyrolactone (GBL) Pre-Review Report" Expert Committee on Drug Dependence Thirty-fifth Meeting Hammamet, Tunisia, Jun. 4-8, 2012.
(Continued)

*Primary Examiner* — Seahvosh Nikmanesh
*Assistant Examiner* — Xiaoming Liu
(74) *Attorney, Agent, or Firm* — TraskBritt (57) ABSTRACT

A method of forming a semiconductor device structure comprises forming a mold template comprising trenches within a mold material. Structures are formed within the trenches of the mold template. A wet removal process is performed to remove the mold template, a liquid material of the wet removal process remaining at least in spaces between adjacent pairs of the structures following the wet removal process. A polymer material is formed at least in the spaces between the adjacent pairs of the structures. At least one dry removal process is performed to remove the polymer material from at least the spaces between the adjacent pairs of the structures. Additional methods of forming a semiconductor device structure, and methods of forming capacitor structures are also described.

18 Claims, 7 Drawing Sheets

(51) Int. Cl.
*H01L 49/02* (2006.01)
*H01L 27/108* (2006.01)

(52) U.S. Cl.
CPC .. *H01L 21/31111* (2013.01); *H01L 27/10808* (2013.01); *H01L 27/10852* (2013.01); *H01L 28/91* (2013.01)

(56) References Cited

U.S. PATENT DOCUMENTS

| | | | |
|---|---|---|---|
| 7,521,378 B2 | 4/2009 | Fucsko et al. | |
| 10,090,376 B2* | 10/2018 | Millward | H01L 28/40 |
| 2002/0127840 A1 | 9/2002 | Smith et al. | |
| 2006/0063882 A1 | 3/2006 | Velev et al. | |
| 2006/0141159 A1 | 6/2006 | Okuda et al. | |
| 2009/0214848 A1* | 8/2009 | Sands | C25D 1/02 428/292.1 |
| 2010/0041204 A1 | 2/2010 | Kiehlbauch et al. | |
| 2010/0314739 A1* | 12/2010 | Kaufmann | H01L 23/5389 257/686 |
| 2011/0139209 A1* | 6/2011 | Lang | B82Y 10/00 136/243 |
| 2011/0223412 A1 | 9/2011 | Cornelius et al. | |
| 2012/0015146 A1 | 1/2012 | Advincula et al. | |
| 2012/0057273 A1 | 3/2012 | Haight et al. | |
| 2012/0061776 A1 | 3/2012 | Cheng et al. | |
| 2012/0126449 A1 | 5/2012 | Hart et al. | |
| 2014/0373384 A1 | 12/2014 | Sirard et al. | |
| 2015/0010784 A1 | 1/2015 | Takahata et al. | |

OTHER PUBLICATIONS

Sheng Xu et al. "Self-powered nanowire devices", Mar. 28, 2010, Nature Nanotechnology 5, 366-373 (2010).

* cited by examiner

METHODS OF FORMING SEMICONDUCTOR DEVICE STRUCTURES, AND METHODS OF FORMING CAPACITOR STRUCTURES

CROSS-REFERENCE TO RELATED APPLICATION

This application is a continuation of U.S. patent application Ser. No. 14/065,662, filed Oct. 29, 2013, now U.S. Pat. No. 10,090,376, issued Oct. 2, 2018, the disclosure of which is hereby incorporated herein in its entirety by this reference.

TECHNICAL FIELD

Embodiments of the disclosure relate to the field of semiconductor device design and fabrication. More specifically, the disclosure, in various embodiments, relates to methods of forming semiconductor device structures, and to methods of forming capacitor structures.

BACKGROUND

A continuing goal of integrated circuit fabrication is to increase integration density. One approach used to achieve increased integration density involves reducing the lateral footprint of individual structures by increasing the aspect ratio (i.e., ratio of height to width or diameter) of the individual structures and the proximity of adjacent structures. However, one problem with this approach is that spaces between closely adjacent high aspect ratio (HAR) structures can act as capillaries during post-formation processes (e.g., "release-related" processes such as cleaning, rinsing, and drying, and "in-use" processes such as post-drying processes), such that liquid (e.g., water) is drawn into such spaces. High surface tension forces resulting from the liquid in the spaces between adjacent HAR structures can cause the adjacent HAR structures to topple or collapse toward each other, bringing the adjacent HAR structures into contact with each other. The spaces between the adjacent HAR structures can produce surface forces (e.g., van der Waals, electrostatic, hydrogen bonding, capillary, solid bridging, etc.) that cause the adjacent HAR structures to statically adhere to each other. Such static adhesion is commonly referred to in the art as "stiction." Stiction between the adjacent HAR structures can substantially impede desired functions of a semiconductor device structure or even render the semiconductor device structure inoperable (e.g., by substantially damaging components of the semiconductor device structure).

A need, therefore, exists for new, simple, and cost-efficient methods of reducing stiction between adjacent HAR structures of a semiconductor device structure. It would be further desirable for the new methods to be applicable to the formation of a variety of semiconductor device structures.

DETAILED DESCRIPTION

Methods of forming semiconductor device structures are disclosed, as are methods of forming capacitor structures. In some embodiments, a method of forming a semiconductor device structure includes forming structures (e.g., HAR structures) using a mold template. The mold template is selectively removed relative to the structures. A liquid material utilized in the removal process is retained at least between adjacent pairs of the structures (e.g., between opposing outer sidewall surfaces of the adjacent pairs of the structures). The liquid material may also be retained between opposing portions (e.g., opposing inner sidewall surfaces) of the structures. A polymer material is formed at least between the adjacent pairs of structures, displacing the liquid material, to enhance the stability of the structures, and may also be formed between opposing portions (if present) of the structures. The polymer material is subsequently removed using a dry removal process. The structures may then be subjected to further processing to form a desired semiconductor device structure, such as a dynamic random access memory (DRAM) structure, a NAND structure, or a microelectromechanical system (MEMS) structure. The methods of the disclosure are simple, cost-effective, and may reduce stiction between adjacent structures and/or between opposing portions of a single structure during the formation of the semiconductor device structure as compared to many conventional methods of forming the semiconductor device structure.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the disclosure are described in detail below. Additional acts to form the complete semiconductor device from semiconductor device structures may be performed by conventional fabrication techniques. Also note, any drawings accompanying the present application are for illustrative purposes only, and are thus not drawn to scale. Additionally, elements common between figures may retain the same numerical designation.

As used herein, the singular forms "a," "an," and "the" are intended to include the plural forms as well, unless the context clearly indicates otherwise.

As used herein, the term "and/or" includes any and all combinations of one or more of the associated listed items.

As used herein, relational terms, such as "first," "second," "top," "bottom," "upper," "lower," "over," "under," etc., are used for clarity and convenience in understanding the disclosure and accompanying drawings and does not connote or depend on any specific preference, orientation, or order, except where the context clearly indicates otherwise.

As used herein, the term "substantially," in reference to a given parameter, property, or condition, means to a degree that one skilled in the art would understand that the given parameter, property, or condition is met with a small degree of variance, such as within acceptable manufacturing tolerances.

FIGS. 1A through 1E, are simplified partial cross-sectional views illustrating embodiments of a method of forming a semiconductor device structure that includes using a polymer material to reduce, or even prevent, adhesion problems (e.g., toppling, collapse, stiction) that may otherwise be associated with forming the semiconductor device structure. With the description as provided below, it will be readily apparent to one of ordinary skill in the art that the methods described herein may be used in various applications. In other words, the methods of the disclosure may be used whenever it is desired to reduce, or even eliminate, adhesion problems associated with the formation of at least a portion of at least one structure.

Figure 1A:
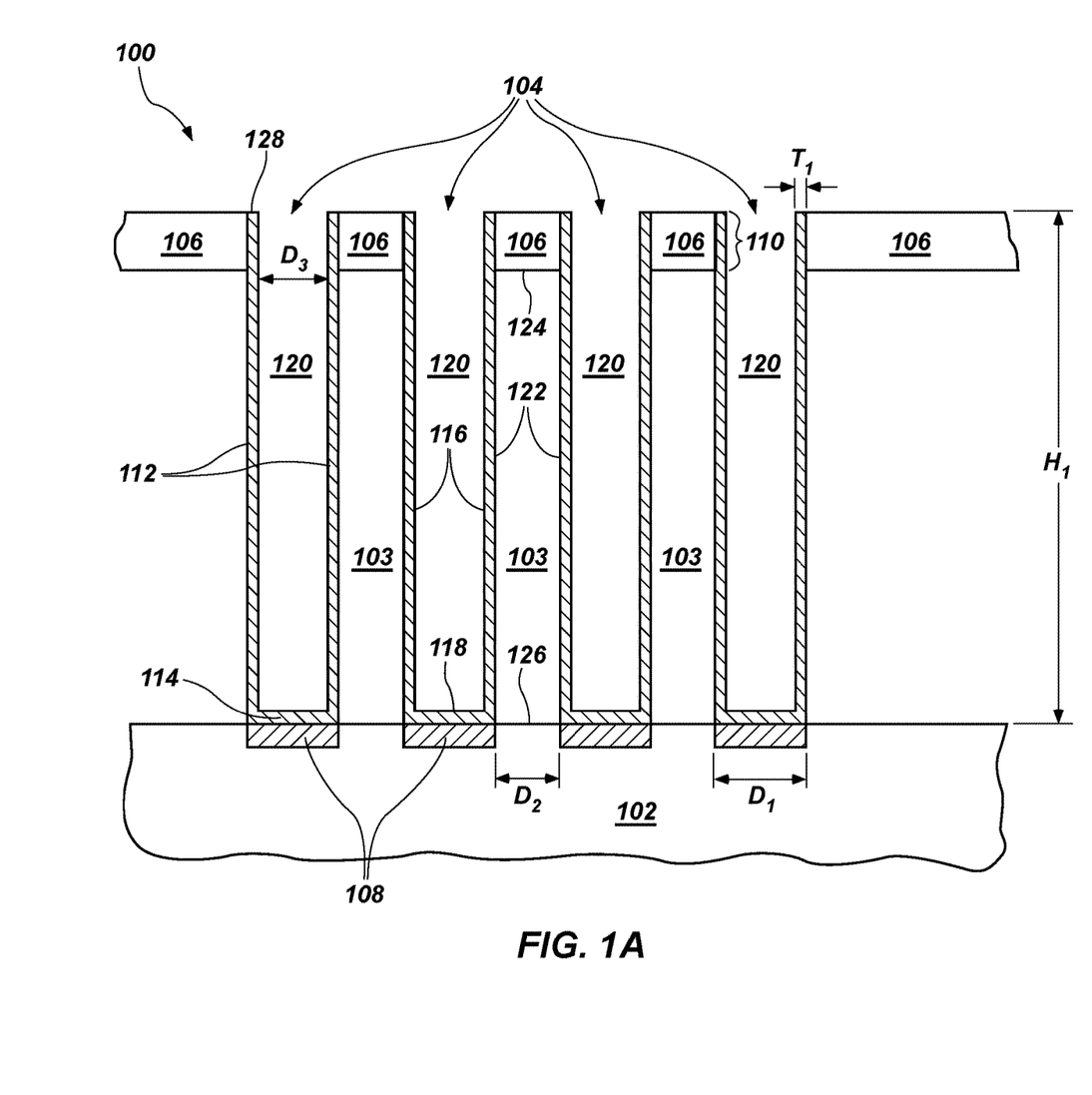
FIGS. 1A through 1E are partial cross-sectional views illustrating different processing stages of a method of forming a semiconductor device structure in accordance with embodiments of the disclosure.

Referring to FIG. 1A, a semiconductor device structure 100 may include a substrate 102, a mold template 103, structures 104, and a retaining structure 106. The structures 104 may be located in, on, or over the substrate 102. As used herein, the term "substrate" means and includes a base material or construction upon which additional materials are formed. For example, the substrate 102 may be a semiconductor substrate, a base semiconductor material on a supporting structure, a metal electrode or a semiconductor substrate having one or more layers, structures or regions formed thereon. The substrate 102 may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. As another example, the substrate 102 may be a non-semiconductive substrate (e.g., an insulative substrate, a conductive substrate). The substrate 102 may be doped or undoped. As depicted in FIG. 1A, in some embodiments, conductive structures 108 may be located between portions of the substrate 102 and the structures 104. The conductive structures 108 may comprise, for example, at least one of doped regions of the substrate 102 and pedestals of a conductive material (e.g., a conductive metal material) located in, on, or over the substrate 102.

The mold template 103 may be located between the substrate 102 and the retaining structure 106. The mold template 103 may be configured (e.g., shaped, sized) for a desired shape, size, and spacing of the structures 104. For example, as shown in FIG. 1A, the shape, size, and spacing of openings 120 within the mold template 103 (and the retaining structure 106) may at least partially determine the shape, size, and spacing of the structures 104. Each of the openings 120 may have substantially the same height $H_1$ and diameter $D_1$ (or width), or at least one of the openings 120 may have a different height and diameter than at least one other of the openings 120. Each of the openings 120 within the mold template 103 may independently have an aspect ratio greater than or equal to about 5:1, such as greater than or equal to about 10:1, greater than or equal to about 20:1, greater than or equal to about 30:1, greater than or equal to about 50:1, or greater than or equal to about 100:1. As used herein, the term "aspect ratio" means and includes a ratio of height to diameter (or width) of a structure or an opening. In some embodiments, each of the openings 120 may independently have an aspect ratio within a range of from about 10:1 to about 50:1. The mold template 103 may have any desired thickness, such as a thickness within a range of from about $5.0 \times 10^3$ Angstroms (Å) to about $5.0 \times 10^4$ Å, such as from about $1.0 \times 10^4$ Å to about $5.0 \times 10^4$ Å, or from about $2.0 \times 10^4$ Å to about $3.0 \times 10^4$ Å. The mold template 103 may be formed of and include of a mold material facilitating the formation of the structures 104, and which may be selectively removed relative to the structures 104 during subsequent processing, as described in further detail below. By way of non-limiting example, the mold template 103 may be formed of and include at least one of an oxide material (e.g., a silicon oxide material, such as at least one of silicon dioxide, borophosphosilicate glass, phosphosilicate glass, borosilicate glass, and spin-on-glass), a silicon material (e.g., polysilicon), and a carbon material. In at least some embodiments, the mold template 103 is formed of and includes silicon dioxide ($SiO_2$). The mold template 103 may be substantially homogeneous (e.g., formed of and including a single, substantially uniform material composition), or may be substantially heterogeneous (e.g., formed of and including at least one of a non-uniform material composition, and a plurality of material compositions).

The retaining structure 106 (also referred to as a "lattice structure") may be located over the mold template 103 and laterally adjacent at least a portion of each of the structures 104, such as laterally adjacent an upper region 110 of sidewalls 112 of each of the structures 104. The retaining structure 106 may be configured to provide structural support to each of the structures 104. For example, the retaining structure 106 may limit at least one of wobbling, toppling, collapse, of each of the structures 104 during and/or after subsequent processing of the semiconductor device structure 100. The retaining structure 106 may include a plurality of holes or vias facilitating access to spaces between adjacent structures of the structures 104. The retaining structure 106 may have any desired thickness, such as a thickness within a range of from about 50 Å to about 3000 Å, or from about 50 Å to about 1000 Å. The retaining structure 106 may be substantially homogeneous (e.g., formed of and including a single, substantially uniform material composition), or may be substantially heterogeneous (e.g., formed of and including at least one of a non-uniform material composition, and a plurality of material compositions). The retaining structure 106 may be formed of and include at least one of silicon nitride (SiN) and a silicon oxide. In at least some embodiments, the retaining structure 106 is formed of and includes SiN. While in FIG. 1A it may appear as though retaining structure 106 is floating, the retaining structure 106 is supported by regions of the semiconductor device structure 100 that are not visible in the cross-section shown in FIG. 1A. Such supporting regions may be analogous to those shown and described in U.S. Patent Publication No. 2005/0054159, now U.S. Pat. No. 7,125,781, issued Oct. 24, 2006.

As shown in FIG. 1A, each of the structures 104 may comprise a container-shaped structure, including an upper surface or upper surfaces 128, and a sidewall or sidewalls 112 integral with a floor 114. For example, a cylindrical container-shaped structure may have only a single, continuous sidewall 112, while a polygonal-shaped container structure may have a plurality of sidewalls 112. The sidewalls 112 and the floor 114 of each of the structures 104 may extend into the openings 120 within the mold template 103 and the retaining structure 106. In turn, inner sidewall surfaces 116 and an upper floor surface 118 of each of the structures 104 may define a space within each of the structures 104 (e.g., an internal void space between opposing sidewalls 112 of each structure 104). In additional embodiments, each of the structures 104 may comprise a different shape including, but not limited to, one of a rectangular column, a cylindrical column, a dome, a pyramid, a frusto pyramid, a cone, a frusto cone, a fin, a pillar, a stud, and an irregular shape. Accordingly, each of the structures 104 may have a desired lateral cross-sectional shape including, but not limited to, an annular shape, a circular shape, a tetragonal shape (e.g., square, rectangular, trapezium, trapezoidal, parallelogram, etc.), a triangular shape, a semicircular shape, an ovular shape, and an elliptical shape. In some embodiments, the lateral cross-sectional shape of each of the structures 104 is substantially annular.

Each of the structures 104 may form a high aspect ratio (HAR) structure. As used herein, the term "high aspect ratio structure" means and includes a structure having a height greater than or equal to about five times a diameter, or width, of the structure (i.e., the structure has an aspect ratio of greater than or equal to about 5:1). For example, an aspect ratio of each of the structures 104 may be within a range of from about 5:1 to about 100:1, such as from about 10:1 to about 50:1, or from about 20:1 to about 30:1. The dimensions of each of the structures 104 may be varied as desired. By way of non-limiting example, as shown in FIG. 1A, at least where each of the structures 104 exhibits a container-shaped structure, the diameter $D_1$ of each of the structures 104 (the same as the diameter $D_1$ of each of the openings 120) may be less than or equal to about 650 Angstroms (Å), such as less than or equal to about 400 Å, or less than or equal to about 250 Å. In at least some embodiments, the diameter $D_1$ of each of the structures 104 is within a range of from about 400 Å to about 650 Å. By way of additional non-limiting example, at least where each of the structures 104 has a container-shaped structure, the height $H_1$ of each of the structures 104 (the same as the height $H_1$ of each of the openings 120) may be greater than or equal to about $1.0 \times 10^4$ Å, such as greater than or equal to about $1.5 \times 10^4$ Å, or greater than or equal to about $2.0 \times 10^4$ Å. In at least some embodiments, the height $H_1$ of each of the structures 104 is within a range of from about $1.0 \times 10^4$ Å to about $2.0 \times 10^4$ Å. In addition, as shown in FIG. 1A, if each of the structures 104 has a container-shaped structure, the sidewalls 112 of each of the structures 104 may have a thickness $T_1$ within a range of from about 40 Å to about 100 Å, such as from about 55 Å to about 80 Å, or from about 60 Å to about 70 Å. A distance $D_3$ may separate the opposing inner sidewall surfaces 116 of each of the structures 104. In additional embodiments, such as where the structures 104 comprise stud-shaped structures, each of the structures 104 may have a thickness up to the diameter $D_1$ (or width) of an associated opening 120 within the mold template 103 and the retaining structure 106. In some embodiments, the structures 104 comprise stud-shaped structures each having a diameter $D_1$ less than or equal to about 250 Å, and a height $H_1$ within a range of from about $1.0 \times 10^4$ Å to about $2.0 \times 10^4$ Å (e.g., about $1.3 \times 10^4$ Å).

Each of the structures 104 may be formed of and include conductive material. By way of non-limiting example, each of the structures 104 may comprise a metal material, such as cobalt (Co), nickel (Ni), palladium (Pd), platinum (Pt), titanium (Ti), zirconium (Zr), hafnium (Hf), vanadium (V), niobium (Nb), tantalum (Ta), molybdenum (Mo), tungsten (W), ruthenium (Ru), alloys thereof, or combinations thereof. Each of the structures 104 may, for example, be formed of and include at least one of elemental titanium (Ti), titanium nitride (TiN), titanium carbide (TiC), a titanium silicide (e.g., TiSi, TiSi$_2$), a titanium oxide (e.g., TiO, TiO$_2$), a titanium alloy (e.g., an alloy including titanium and at least one of zinc, cadmium, mercury, aluminum, gallium, indium, tin, silicon, germanium, lead, arsenic, and antimony). In at least some embodiments, each of the structures 104 is formed of and includes TiN. Alternatively, at least one of the structures 104 may be formed of a different material, such as at least one of a dielectric material (e.g., silicon dioxide, silicon nitride, silicon oxynitride, another dielectric oxide material, a dielectric polymer material), and a semiconductive material (e.g., silicon-germanium, germanium, gallium arsenide, gallium nitride, indium phosphide).

Each of the structures 104 may be disposed at select locations across a surface of the substrate 102. By way of non-limiting example, the structures 104 may be disposed in an ordered array over and in contact with the substrate 102. The ordered array may include a plurality of rows and a plurality of columns across a top surface 126 of the substrate 102. The plurality of rows may run in a direction substantially perpendicular to the plurality of columns. In additional embodiments, each of the structures 104 may be disposed at random locations across the surface of the substrate 102. As shown in FIG. 1A, the locations of the structures 104 may depend on the locations of the openings 120 within the mold template 103 and the retaining structure 106.

The structures 104 may be substantially isolated from one another, such that at least a majority of the structures 104 do not contact one another. The mold template 103 may intervene between adjacent pairs of the structures 104. As a non-limiting example, as shown in FIG. 1A, if each of the structures 104 comprises a container-shaped structure, the mold template 103 may be disposed between outer sidewall surfaces 122 of adjacent pairs of the structures 104. Accordingly, the outer sidewall surfaces 122 of the adjacent pairs of the structures 104, as well as a bottom surface 124 of the retaining structure 106 and the top surface 126 of the substrate 102, may at least partially define pillars of the mold template 103. Adjacent pairs of the structures 104 may be separated or spaced by any desired distance $D_2$. The distance $D_2$ between adjacent pairs of the structures 104 may, for example, be less than or equal to about 650 Å, less than or equal to about 400 Å, or less than or equal to about 200 Å. In some embodiments, the distance $D_2$ between adjacent pairs of the structures 104 may be within a range of from about 200 Å to about 600 Å.

The semiconductor device structure 100 may be formed using conventional processes (e.g., deposition processes, material removal processes) and conventional processing equipment, which are not described in detail herein. As a non-limiting example, the semiconductor device structure 100 may be formed using techniques substantially similar to those shown and described in U.S. Patent Publication No. 2005/0054159, now U.S. Pat. No. 7,125,781, issued Oct. 24, 2006.

Figure 1B:
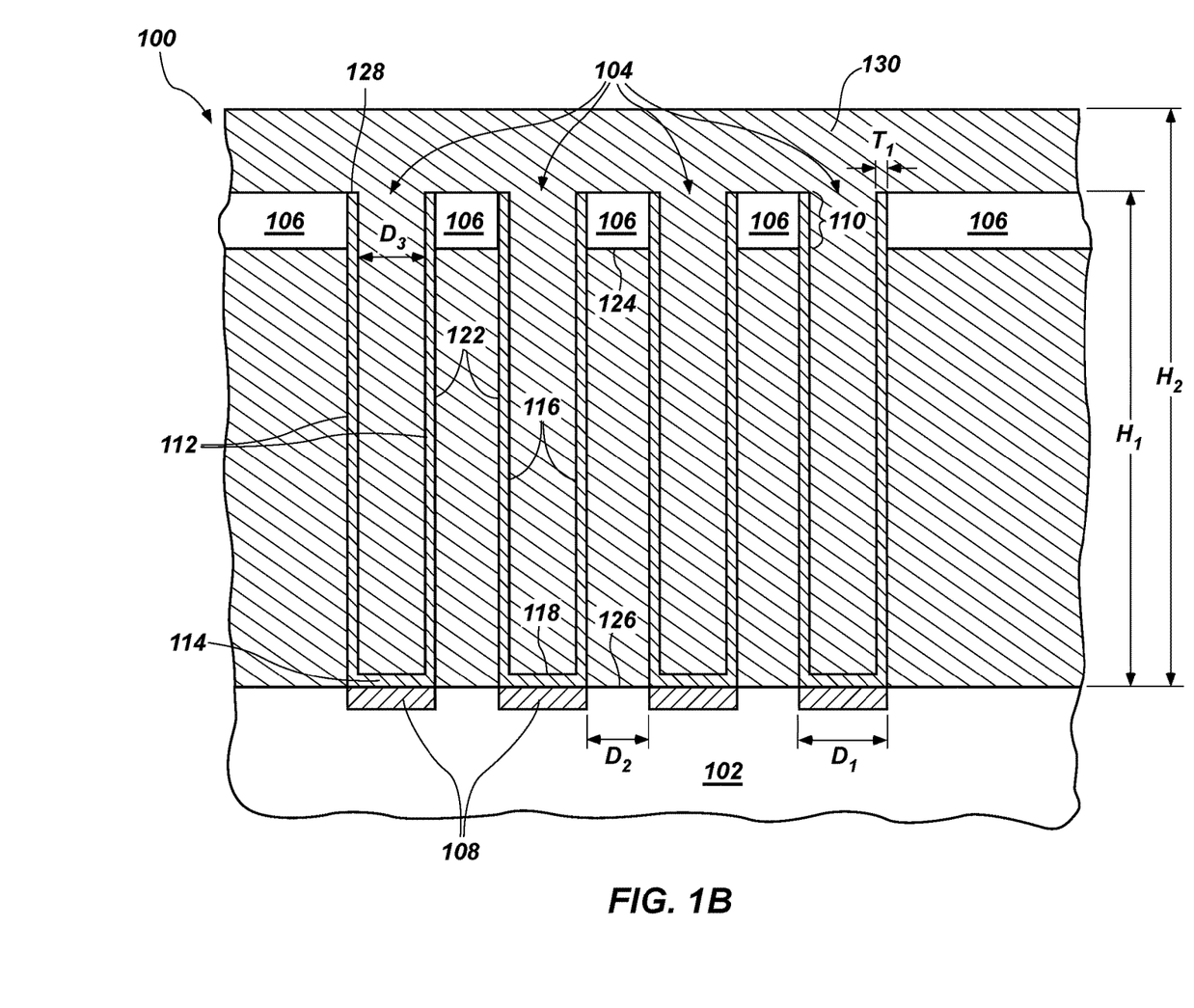

Referring next to FIG. 1B, the semiconductor device structure 100 may be subjected to at least one wet removal process (e.g., a wet etching process) to remove the mold template 103 (FIG. 1A). The wet removal process may selectively remove the mold template 103, and may clean and rinse exposed surfaces of the substrate 102, the structures 104, and the retaining structure 106. The wet removal process may be performed using conventional processes and equipment, which are not described in detail herein. By way of non-limiting example, the wet removal process may include exposing the semiconductor device structure 100 to an aqueous halogen acid (e.g., hydrofluoric acid), followed by exposure to tetramethylammonium hydroxide (TMAH), followed by another exposure to an aqueous halogen acid (e.g., hydrofluoric acid), followed by exposure to (e.g., at least one rinse with) one or more of deionized (DI) water and isopropyl alcohol (IPA).

Following the wet removal process, liquid material 130 remains over and between the structures 104. The liquid material 130 may comprise at least one component utilized in the wet removal process, such as at least one of DI water and IPA. In some embodiments, the liquid material 130 is DI water. In additional embodiments, the liquid material 130 is IPA. The liquid material 130 may be homogeneous (e.g., formed of and including a single, substantially uniform material composition), or the liquid material 130 may be heterogeneous (e.g., formed of and including at least one of a non-uniform material composition, and a plurality of material compositions). If homogeneous, amounts of the component (e.g., DI water, IPA) utilized in the wet removal process may not substantially vary throughout a height $H_2$ of the liquid material 130. If heterogeneous, amounts of the component may vary throughout the height $H_2$ of the liquid material 130. By way of non-limiting example, the amount of the component may increase, may decrease, may decrease and then increase, or may increase and then decrease in a direction extending toward the top surface 126 of the substrate 102. The liquid material 130 may, for example, have a linear concentration distribution (e.g., a linear gradient), a stepwise concentration distribution (e.g., a stepwise gradient), or a Gaussian concentration distribution of the component throughout the height $H_2$ of the liquid material 130.

As shown in FIG. 1B, if the structures 104 comprise container-shaped structures, the liquid material 130 (e.g., DI water, IPA) may remain between the outer sidewall surfaces 122 of adjacent pairs of the structures 104, and may also remain between the inner sidewall surfaces 116 of each of the structures 104. The liquid material 130 may at least partially fill a space between the adjacent pairs of the structures 104 (e.g., a space between the outer sidewall surfaces 122 of adjacent pairs of the structures 104), and may also at least partially fill the space between adjacent portions of each of the structures 104 (e.g., the space between the inner sidewall surfaces 116 of each of the structures 104). As depicted in FIG. 1B, in some embodiments, the structures 104 are substantially immersed (e.g., submerged) within the liquid material 130, such that the height $H_2$ of the liquid material 130 is greater than the height $H_1$ of the structures 104. The liquid material 130 may extend to a location above the upper surfaces 128 of the structures 104, and may substantially cover and surround surfaces (e.g., exposed portions of the inner sidewall surfaces 116, the upper floor surfaces 118, the outer sidewall surfaces 122, and the upper surfaces 128) of the structures 104. In additional embodiments, the structures 104 are partially immersed within the liquid material 130, such that the height $H_2$ of the liquid material 130 is less than or equal to the height $H_1$ of the structures 104. The liquid material 130 may extend to a location at or below the upper surfaces 128 of the structures 104 (e.g., a location at or below the bottom surface 124 of the retaining structure 106), and may cover and surround less than an entirety of the exposed surfaces of the structures 104.

Figure 1C:
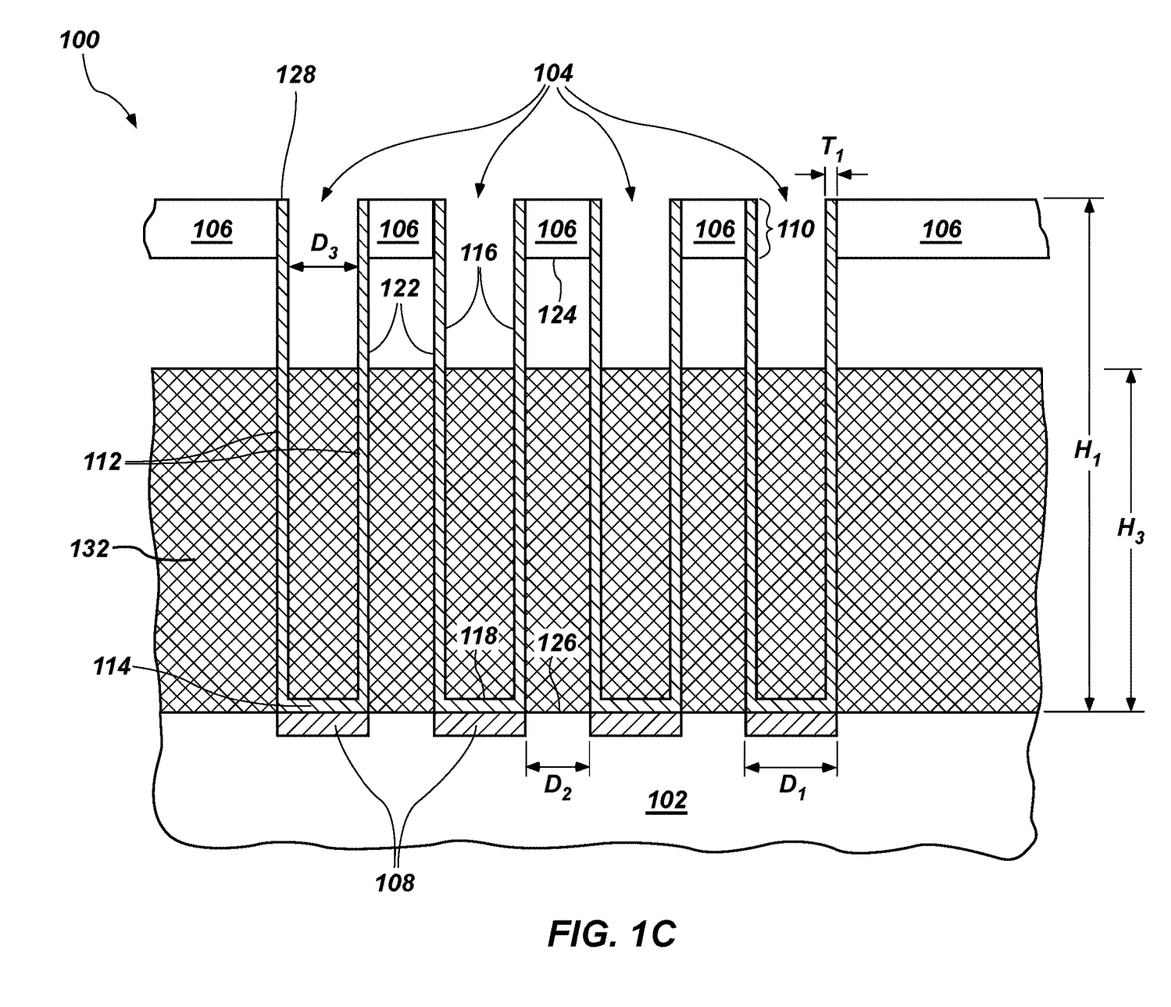

Referring next to FIG. 1C, a polymer material 132 may be formed between and/or within the structures 104. For example, as shown in FIG. 1C, the polymer material 132 may at least partially fill the space between adjacent pairs of the structures 104, and may also at least partially fill the space between adjacent portions (e.g., the inner sidewall surfaces 116) of each of the structures 104. The polymer material 132 may be formed to a height $H_3$ sufficient to stabilize the structures 104 and circumvent adhesion problems (e.g., toppling, collapse, and stiction) between adjacent pairs of the structures 104, and/or between different portions (e.g., inner sidewall surfaces 116) of one or more of the structures 104. For example, after forming the polymer material 132, the height of a free-standing (e.g., exposed, unsupported) portion, if any, of each of the structures 104 may be sufficiently low so as to prevent toppling and collapse of the structures 104. In some embodiments, the polymer material 132 extends to a location below the upper surfaces 128 of the structures 104, such as a location at or below the bottom surface 124 of the retaining structure 106. In additional embodiments, the polymer material 132 extends to a location at or above the upper surfaces 128 of the structures 104.

As depicted in FIG. 1C, the polymer material 132 may directly contact at least one surface of the semiconductor device structure 100 (e.g., one or more surfaces of the substrate 102 and the structures 104, such as at least one of the top surface 126 of the substrate 102, the inner sidewall surfaces 116 of the structures 104, the upper floor surfaces 118 of the structures 104, and the outer sidewall surfaces 122 of the structures 104). In additional embodiments, at least one material (e.g., a wetting material, an adhesive material) may intervene between the polymer material 132 and at least one surface of the semiconductor device structure 100. The polymer material 132 may be at least partially attached (e.g., directly bonded, and/or indirectly bonded) to at least one surface of the semiconductor device structure 100, or the polymer material 132 may be substantially unattached (e.g., not directly bonded, and not indirectly bonded) to any of the surfaces of the semiconductor device structure 100.

The polymer material 132 may be a substantially solid material comprising a polymer matrix formed of and including at least one polymer. As described in further detail below, the polymer may comprise a polymer formulated to rapidly fill the spaces between and/or within the structures 104, and formulated to be subsequently removed without oxidizing the structures 104. For example, the polymer may comprise at least one of a water-soluble polymer and a water-insoluble polymer formulated to disperse (e.g., diffuse, precipitate) into the spaces between and/or within the structures 104 in less than or equal to about 1 minute (e.g., less than or equal to about 30 seconds, less than or equal to about 15 seconds, or less than or equal to about 10 seconds), and formulated to be removed with a reducing agent (e.g., a reducing plasma, such as a plasma including at least one of hydrogen and ammonia). Non-limiting examples of suitable water-soluble polymers include poly(ethylene oxide) (PEO), poly(acrylic acid) (PAA), poly(hydroxystyrene) (PHS), poly(ethylene glycol) (PEG), and poly(vinylpyridine) (PVP). Non-limiting examples of suitable water-insoluble polymers include poly(methyl methacrylate) (PMMA), poly(styrene) (PS), poly(dimethylsiloxane) (PDMS), poly(ethylene) (PE), poly(propylene) (PP), and poly(vinylpyrrolidone). By way of example, the polymer may be a conventional photoresist material, such as a negative tone develop photoresist. The polymer may also be formulated to be non-volatile up to a temperature of an optional thermal anneal process utilized to form the polymer material 132, as described in further detail below. The polymer of the polymer material 132 may be crosslinked, or the polymer of the polymer material 132 may be non-crosslinked.

The polymer material 132 may include void spaces (e.g., pores) between and amongst the polymer. The quantity and size of the void spaces may be tailored to prevent toppling and collapse of the structures 104. By way of non-limiting example, the void spaces may comprise less than or equal to about 40 percent of the total volume of the polymer material 132, such as less than or equal to about 30 percent of the total volume, less than or equal to about 20 percent of the total volume, less than or equal to about 10 percent of the total volume, less than or equal to about 5 percent of the total volume, or less than or equal to about 1 percent of the total volume. In addition, the size of each of the void spaces may be less than or equal to the distance $D_2$ between adjacent pairs of the structures 104, and/or the distance $D_3$ between opposing portions (e.g., the opposing inner sidewall surfaces 116) of one or more of the structures 104. Each of the void spaces may be substantially free of non-gaseous material (e.g., liquid material, solid material), or at least some of the void spaces may be at least partially filled with non-gaseous material. Furthermore, each of the void spaces may be discrete (e.g., discontinuous) from each other of the void spaces, or at least some of the void spaces may be integral (e.g., continuous) with at least some other of the void spaces. In additional embodiments, the polymer material 132 is substantially free of void spaces.

The polymer material 132 may be formed between and/or within the structures 104 without previously performing a separate act to substantially remove the liquid material 130 (FIG. 1B) from the spaces between and/or within the structures 104. At least partially maintaining the liquid material 130 in the spaces between and/or within the structures 104 during the formation of the polymer material 132 may prevent damage (e.g., toppling, collapse, stiction) that would otherwise result from surface tension forces associated with removing the liquid material 130. As a non-limiting example, to form the polymer material 132, a polymeric solution including the polymer and at least one solvent may be applied over the liquid material 130 (FIG. 1B) and the structures 104 so as to disperse into (e.g., diffuse into, precipitate into) the liquid material 130 and at least partially fill the space between adjacent pairs of the structures 104, and/or the space between opposing portions (e.g., the opposing inner sidewall surfaces 116) of each of the structures 104. As used herein, the term "solution" means and includes a solution of the polymer in the solvent, a suspension of the polymer in the solvent, an emulsion of the polymer in the solvent, or combinations thereof. Since a person of ordinary skill in the art will recognize whether a particular reference describes a solution, a suspension, an emulsion or a combination thereof from the context, for the purposes of readability and claiming the invention, the term "solution" refers collectively to a solution, a suspension, an emulsion, or a combination thereof.

The solvent of the polymeric solution may comprise at least one of water (e.g., DI water), and a water-miscible solvent compatible with the polymer and the components of the semiconductor device structure 100 (e.g., the substrate 102, the structures 104, and the retaining structure 106). As used herein, the term "compatible" means and includes a material that does not substantially react, break down, or absorb another material in an unintended way, and that also does not substantially impair the chemical and/or mechanical properties of the another material in an unintended way. Non-limiting examples of suitable water-miscible solvents include IPA, propylene glycol monomethyl ether (PGME), and propylene glycol methyl ether acetate (PGMEA). In some embodiments, the solvent is DI water.

Optionally, the polymeric solution may also include at least one additional additive, such as at least one of a diffusion control agent, a solubility control agent, a wetting agent, a surfactant, a binder, a crosslinking agent, and an acid generator. The diffusion control agent, if present, may comprise at least one material formulated to control (e.g., increase, decrease) a rate at which the polymer diffuses into the spaces between and/or within the structures 104. The solubility control agent, if present, may comprise at least one material formulated to control (e.g., increase, decrease) the solubility of the polymer in at least one of the solvent and the liquid material 130 (FIG. 1B). The crosslinking agent, if present, may comprise at least one material formulated to react with at least one moiety of the polymer in the presence of at least one of heat and acid to react different polymer molecules, or different portions of a long polymer molecule. The acid generator, if present, may comprise at least one of a thermal acid generator and a photoacid generator.

If the polymer comprises a water-soluble polymer (e.g., PEO, PEG, PHS, PVP, PMA), the polymer solution may be applied over the liquid material 130 (FIG. 1B) and the structures 104, and the water-soluble polymer may diffuse (e.g., by way of forward osmosis) through the retaining structure 106 and into the spaces between and/or within the structures 104. The polymer solution may include any concentration of the water-soluble polymer sufficient to facilitate the rapid diffusion of the water-soluble polymer into the spaces between and/or within the structures 104. In some embodiments, an amount of the water-soluble polymer sufficient to prevent toppling and collapse of the structures 104 is diffused into the spaces between and/or within the structures 104 in less than or equal to about 30 seconds.

If the polymer comprises a water-insoluble polymer (e.g., PDMS, PS, PE, PP, poly(vinylpyrrolidone)), the polymer solution may be applied over the liquid material 130 (FIG. 1B) and the structures 104, and upon contacting at least a portion of the liquid material 130, the polymer may at least partially precipitate out of solution and at least partially fill the spaces between and/or within the structures 104. The polymer may precipitate out of solution upon reaching a portion of the liquid material 130 having a concentration of the at least component (e.g., DI water, IPA) of the wet removal process sufficient to facilitate the precipitation of the polymer. As a non-limiting example, if the liquid material 130 is homogeneous, the polymer may precipitate out of solution substantially immediately after contacting an upper surface of the liquid material 130. As another non-limiting example, if the liquid material 130 is heterogeneous, the polymer may precipitate out of solution upon reaching a lower portion of the liquid material 130 (e.g., a portion proximate the top surface 126 of the substrate 102) comprising a greater concentration of at least one of DI water and IPA than an upper portion of the liquid material 130 (e.g., a portion proximate the upper surface of the liquid material 130). The precipitation of the polymer may fill the spaces between and/or within the structures 104 from the bottoms thereof (e.g., the upper floor surfaces 118 of the structures 104, and the top surface 126 of the substrate 102) toward the tops thereof (e.g., the upper surface 128 of the structures 104, and the bottom surface 124 of the retaining structure 106). Accordingly, during the formation of the polymer material 132, the spaces between and/or within the structures 104 may comprise a multi-phase solution including a solid phase comprising the polymer, and a liquid phase comprising a portion of the liquid material 130. The polymer solution may have any concentration of the water-insoluble polymer sufficient to facilitate the formation of the polymer material 132. In some embodiments, an amount of the water-insoluble polymer sufficient to prevent toppling and collapse of the structures 104 is precipitated into the spaces between and/or within the structures 104 in less than or equal to about 30 seconds.

The polymeric solution may be applied over the liquid material 130 (FIG. 1B) and the structures 104 using conventional processes, which are not described in detail herein. By way of non-limiting example, the polymeric solution may be applied over the liquid material 130 and the structures 104 using a spin-coating process. The polymeric solution may be spin-coated over the liquid material 130 and the structures 104, and the polymer of the polymeric solution may be permitted to disperse into (e.g., diffuse into, precipitate into) the spaces between and/or within the structures 104 until an amount of the polymer sufficient to stabilize the structures 104 and substantially circumvent adhesion problems between adjacent pairs of the structures 104, and/or between different portions (e.g., inner sidewall surfaces 116) of one or more of the structures 104, is achieved. By way of non-limiting example, the polymeric solution may be spin-coated over the liquid material 130 and the structures 104 for a period of time within a range of from about 1 second to about 1 minute (e.g., from about 1 second to about 30 seconds, from about 1 second to about 20 seconds, or from about 1 second to about 10 seconds), and may be permitted to disperse into the spaces between and/or within the structures 104 for another period of time within a range of from about 1 second to about 2 minutes (e.g., about 1 second to about 1 minute, 1 second to about 30 seconds, or from about 1 second to about 20 seconds). The polymeric solution may be spin-coated over the liquid material 130 and the structures 104 using a suitable spin rotation rate, such as a spin rotation rate within a range of from about 500 rotations per minute (rpm) to about 6,000 rpm. In some embodiments, the polymeric solution is spin-coated over the liquid material 130 for about 10 seconds, and is permitted to disperse into the spaces between and within the structures 104 for about 30 seconds. The spin-coating process may simultaneously disperse the polymeric solution and remove at least a portion of the liquid material 130.

After at least partially filling the spaces between and/or within the structures 104 with the polymer of the polymeric solution, the semiconductor device structure 100 may be subjected to at least one liquid removal process to substantially remove liquid remaining within the spaces between and/or within the structures 104 and form the polymer material 132. By way of non-limiting example, the semiconductor device structure 100 may be subjected to at least one of a spin-drying process and a thermal annealing process to substantially remove liquid remaining within the spaces between and/or within the structures 104. In some embodiments, the semiconductor device structure 100 is subjected to a spin-drying process to substantially remove liquid remaining within the spaces between and/or within the structures 104 and form the polymer material 132. For example, the semiconductor device structure 100 may be dried using a spin rotation speed within a range of from about 500 rotations per minute (rpm) to about 6,000 rpm, and a duration of from about 1 second to about 5 minutes (e.g., from about 5 seconds to about 2 minutes, from about 5 seconds to about 1 minute, or from about 5 seconds to about 30 seconds). In additional embodiments, the semiconductor device structure 100 is subjected to a thermal anneal process following the spin-drying process. For example, the semiconductor device structure 100 may be thermally annealed at a temperature of from about 21° C. to about 350° C. (e.g., from about 100° C. to about 200° C.), for a duration within a range of from about 30 seconds to about 5 minutes (e.g., from about 30 seconds to about 3 minutes, from about 1 minute to about 3 minutes, or from about 1 minute to about 2 minutes). If performed, the thermal anneal process may remove liquid remaining within the spaces between and/or within the structures 104, and/or may facilitate one or more reactions (e.g., crosslinking reactions) with the polymer. Without being bound by any theory, it is believed that the polymer material 132 eliminates capillary forces present in the structures 104 because there is no air/liquid interface.

Figure 1D:
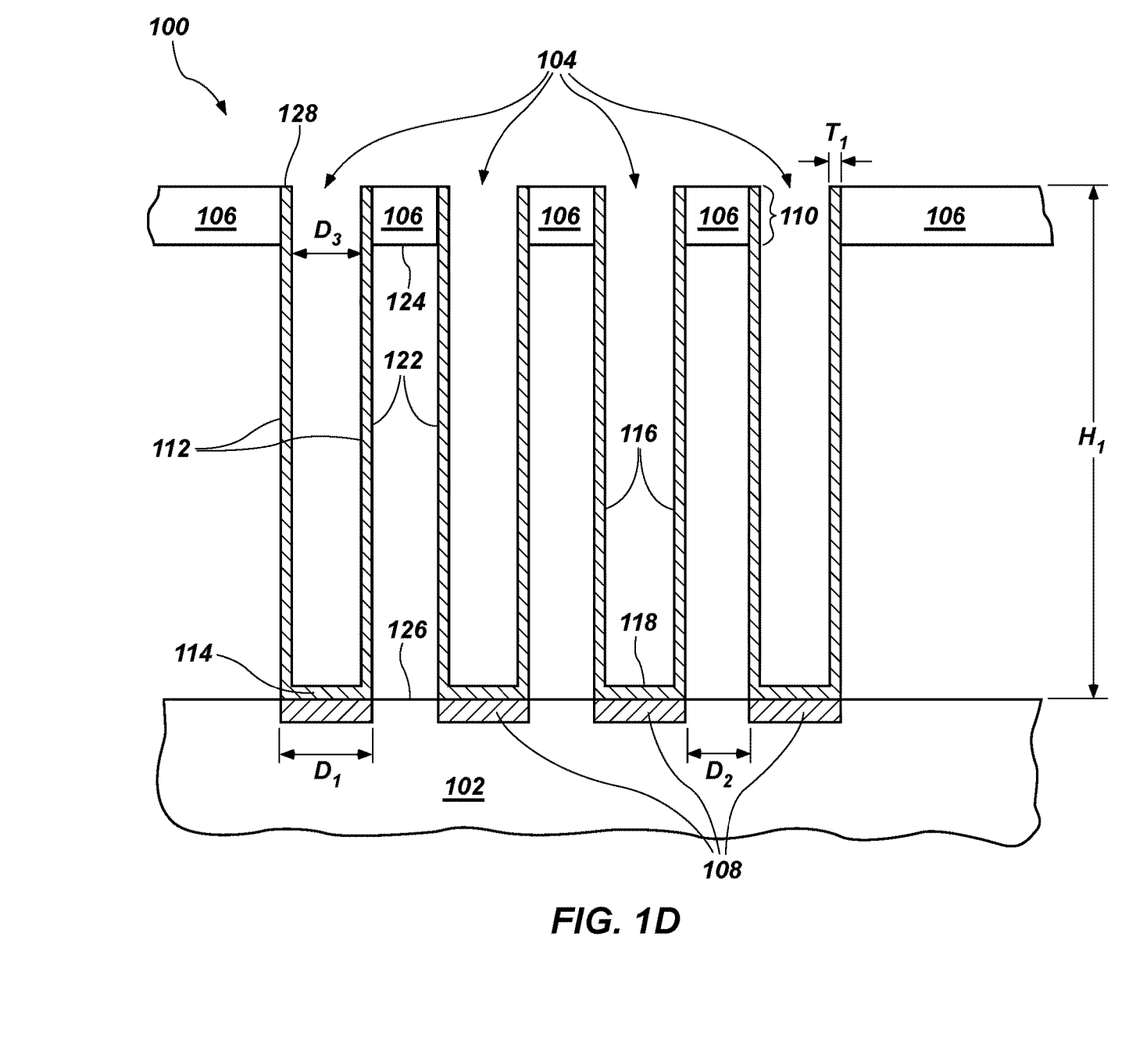

Referring to next FIG. 1D, the polymer material 132 (FIG. 1C) may be volatilized and removed from the spaces between and/or within the structures 104. Any process which does not result in stiction of adjacent pairs of the structures 104 and/or of opposing portions (e.g., the opposing inner sidewall surfaces 116) of the structures 104 may be used to remove the polymer material 132. For example, the polymer material 132 may be removed by at least one dry removal process. Since the polymer material 132 is selectively removed, the polymer material 132 may be considered a sacrificial material. The dry removal of the polymer material 132 may prevent toppling or collapse of the structures 104 (and, hence, may eliminate adhesion-related damage to the semiconductor device structure 100). Non-limiting examples of suitable dry removal processes include thermally annealing the semiconductor device structure 100 at or above a decomposition temperature of the polymer material 132, and exposing the semiconductor device structure 100 to one or more of an reducing agent, a reducing plasma, high energy radiation (e.g., ultraviolet radiation), and reactive ions. In some embodiments, the polymer material 132 is volatilized and removed from the spaces between and/or within the structures 104 using a reducing plasma. By way of non-limiting example, the semiconductor device structure 100 may be exposed to a reducing plasma comprising at least one of $NH_3$ and $H_2$. In additional embodiments, the polymer material 132 is volatilized and removed from the spaces between and/or within the structures 104 using a thermal anneal in a reducing atmosphere. By way of non-limiting example, the semiconductor device structure 100 may be exposed to a temperature with a range of from about 150° C. to about 750° C. in at least one of an $NH_3$ atmosphere and an $H_2$ atmosphere.

Thus, in accordance with embodiments of the disclosure, a method of forming a semiconductor device structure comprises forming a mold template comprising trenches within a mold material. Structures are formed within the trenches of the mold template. A wet removal process is performed to remove the mold template, a liquid material of the wet removal process remaining at least in spaces between adjacent pairs of the structures following the wet removal process. A polymer material is formed at least in the spaces between the adjacent pairs of the structures. At least one dry removal process is performed to remove the polymer material from at least the spaces between the adjacent pairs of the structures.

Furthermore, in accordance with additional embodiments of the disclosure, a method of forming a semiconductor device structure comprises performing at least one process to remove a material at least partially surrounding a structure and leave the structure at least partially surrounded by a liquid material. At least one polymer is delivered into the liquid material. Remaining portions of the liquid material are removed after delivering the polymer into the liquid material to form a solid polymer material at least partially surrounding the structure. The solid material is removed.

In addition, in accordance with additional embodiments of the disclosure, a method of forming a semiconductor structure comprises forming a polymer matrix around high aspect ratio structures overlying a substrate, the polymer matrix configured and positioned to prevent adhesion-related damage to the high aspect ratio structures. At least one dry removal process is performed to remove the polymer matrix around the high aspect ratio structures.

Figure 1E:
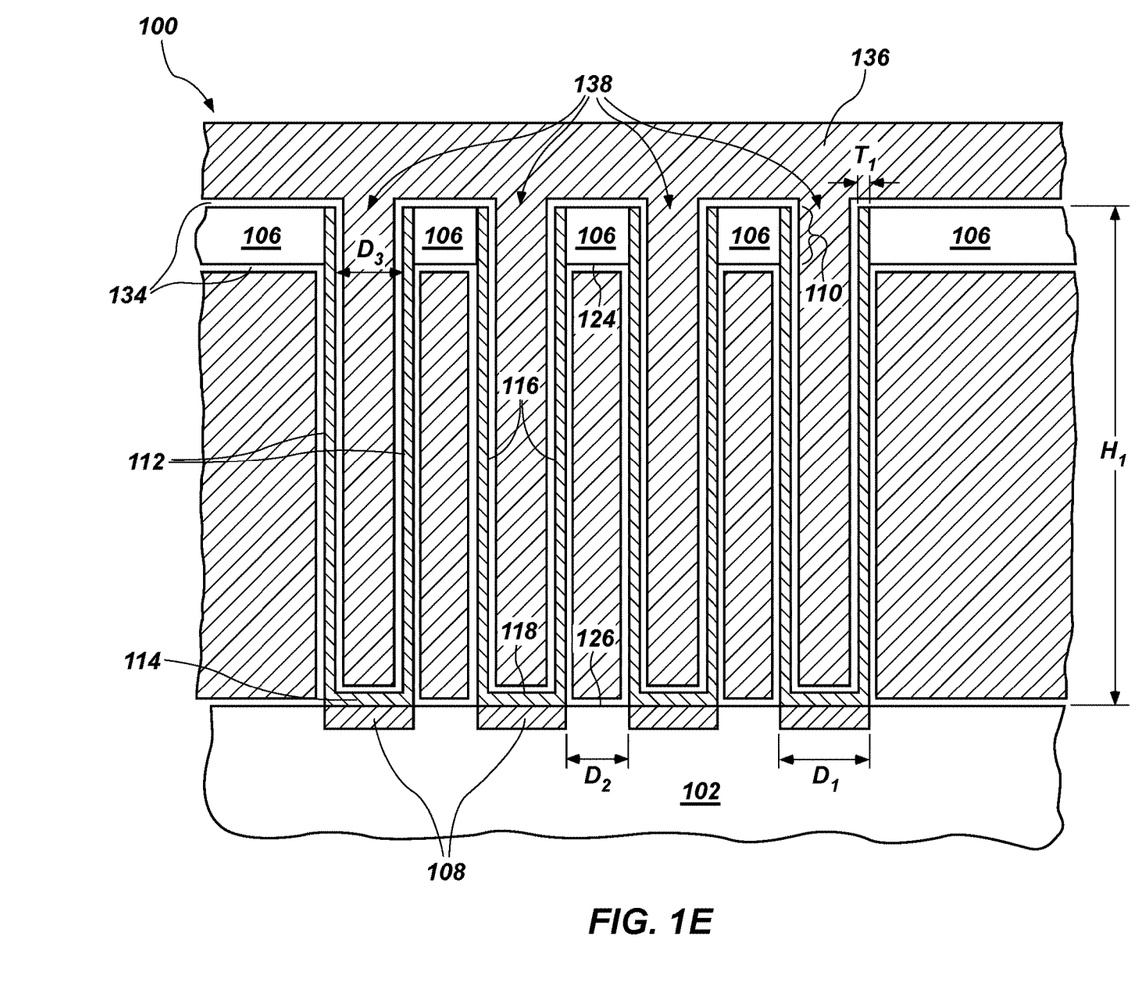

Referring to FIG. 1E, following the removal of the polymer material 132, the semiconductor device structure 100 may be subjected to additional processing. By way of non-limiting example, as shown in FIG. 1E, a dielectric material 134 may be formed over and in contact with exposed surfaces of the semiconductor device structure 100 (e.g., exposed surfaces of each of the substrate 102, the retaining structure 106, and the structures 104), and a conductive material 136 may be formed over and in contact with the dielectric material 134. The dielectric material 134 may substantially conform to the exposed surfaces of the semiconductor device structure 100, and the conductive material 136 may fill remaining spaces between and/or within the structures 104 (FIG. 1C). The dielectric material 134 may be formed of and include at least one electrically insulative material including, but not limited to, an electrically insulative oxide, and an electrically insulative nitride. The conductive material 136 may be formed of and include at least one electrically conductive material including, but not limited to, a metal (e.g., platinum, titanium, tungsten, ruthenium, etc.), a metal-containing composition (e.g., a metal nitride, a metal silicide, etc.), and a conductively doped semiconductor material (e.g., conductively doped silicon, conductively doped germanium, etc.). The dielectric material 134 and the conductive material 136 may be formed using conventional techniques, such as a physical vapor deposition ("PVD") technique, a chemical vapor deposition ("CVD") technique, or an atomic layer deposition ("ALD") technique. PVD includes, but is not limited to, sputtering, evaporation, or ionized PVD. Such deposition techniques are known in the art and, therefore, are not described in detail herein.

With continued reference to FIG. 1E, the conductive material 136, dielectric material 134, and the structures 104 (FIG. 1C) form a plurality of capacitors 138. The conductive material 136 may be considered to form a capacitor plate extending across the plurality of capacitors 138. The plurality of capacitors 138 may be electrically coupled to a plurality of bit lines through a plurality of transistor gates. The bit lines and the transistor gates may be conventionally formed at an appropriate processing stage. The transistor gates may be coupled to a plurality of word lines. The combination of the word lines and the bit lines may facilitate addressing of dynamic random access memory (DRAM) cells including the plurality of capacitors 138. The plurality of capacitors 138 may, therefore, be incorporated into a DRAM array.

Thus, in accordance with embodiments of the disclosure, a method of forming capacitor structures comprises forming conductive structures having an aspect ratio of greater than or equal to about 10:1 in trenches within a mold template. The mold template is removed with at least one wet etchant after forming the conductive structures. The conductive structures are at least partially submerged in at least one of deionized water and isopropyl alcohol after removing the mold template. A polymeric solution comprising at least one polymer in a water-miscible solvent is spin-coated over the at least one of the deionized water and the isopropyl alcohol. Remaining portions of the at least one of the deionized water and the isopropyl alcohol are removed to form a solid polymer material. The solid polymer material is removed using at least one of a thermal anneal and a dry reducing agent.

Figure 2A:
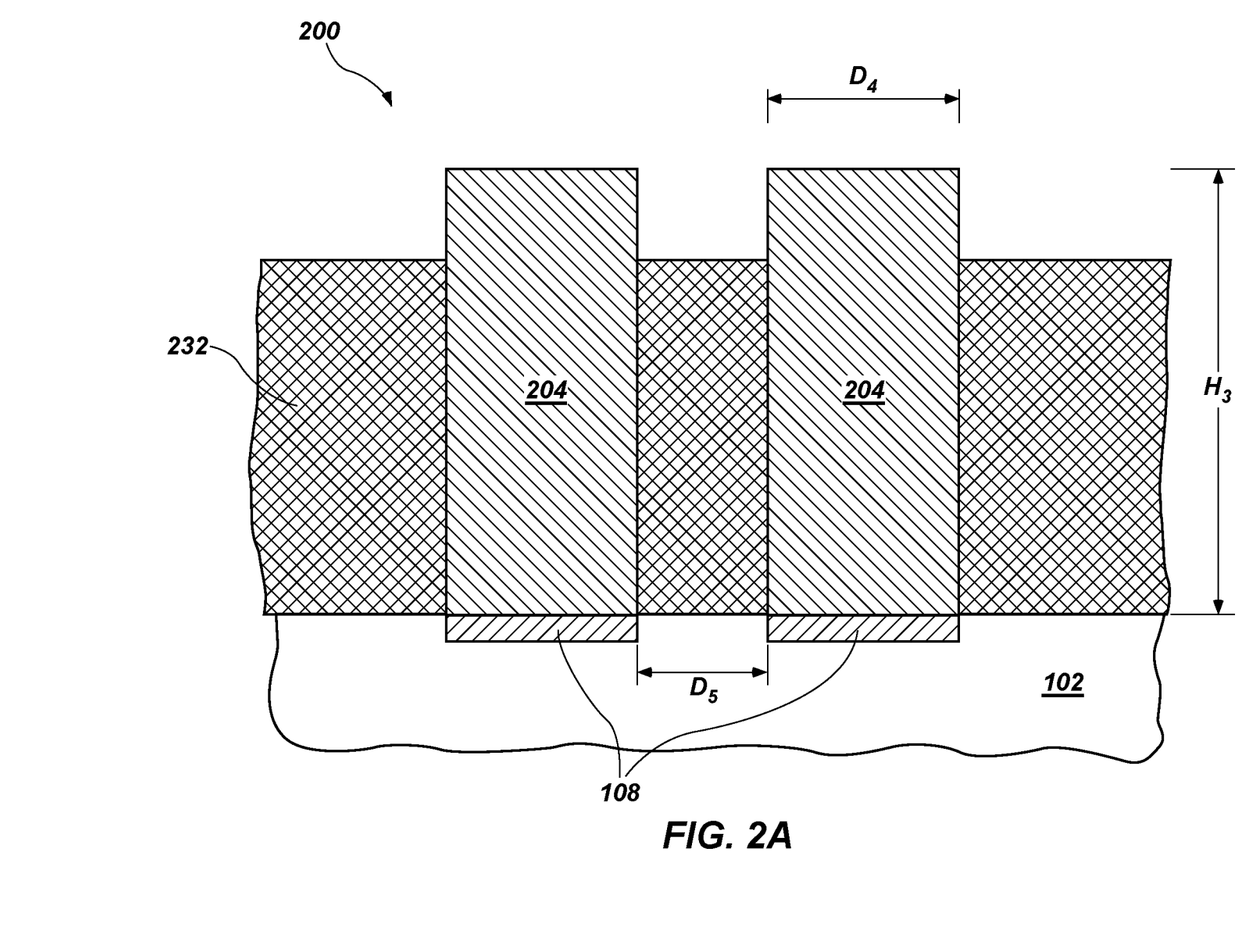
FIGS. 2A and 2B are partial cross-sectional views illustrating different processing stages of a method of forming a semiconductor device structure in accordance with embodiments of the disclosure.
Figure 2B:
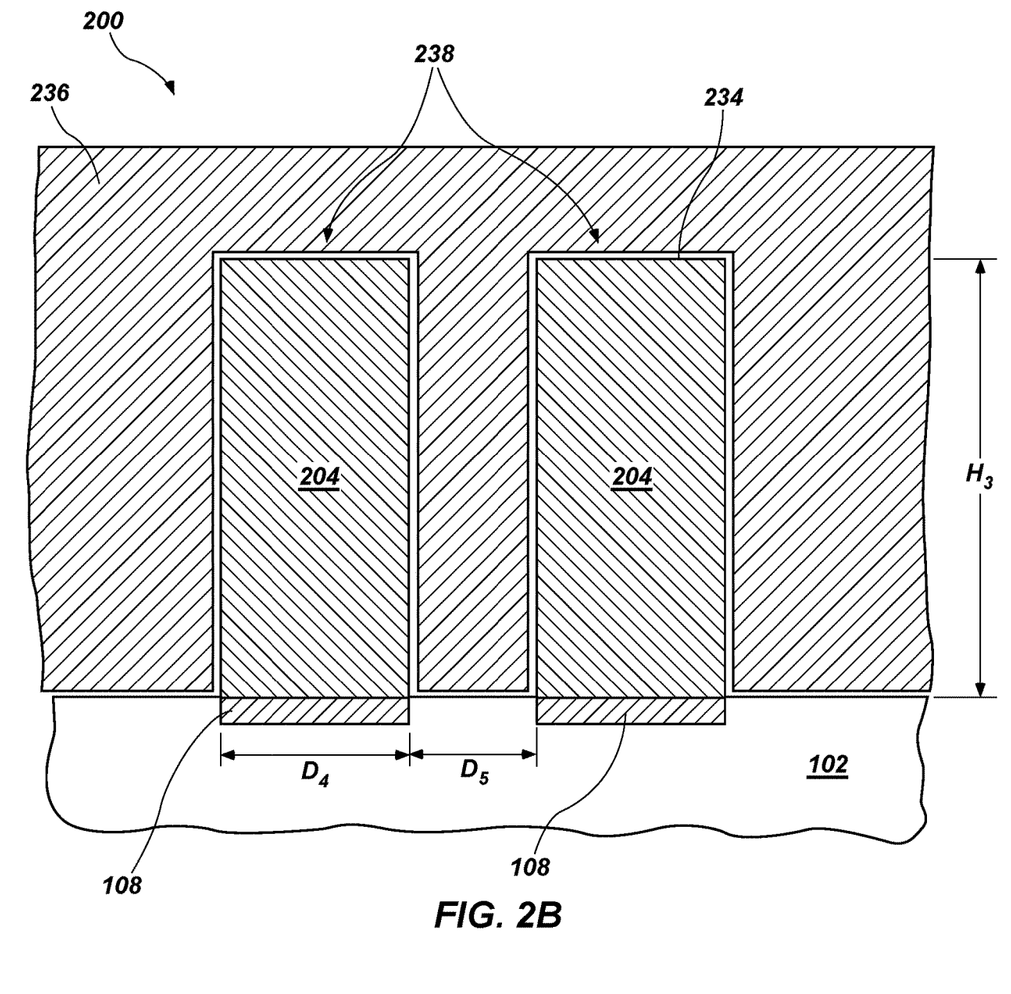

As previously described above, the methods of the disclosure may be applicable to structures in addition to those depicted in FIGS. 1A-1E. By way of non-limiting example and referring to FIG. 2A, the above process may be used to form a polymer material 232 in spaces between adjacent pairs of structures 204 of a semiconductor device structure 200. Each of the structures 204 may be formed of and include one or more of the materials previously described in relation to the structures 104, or may be formed of and include at least one different material. As shown in FIG. 2A, each of the structures 204 may have a stud-type shape. Each of the structures 204 may have a diameter $D_4$ (or width) and a height $H_3$ substantially similar to the diameter $D_1$ (or width) and the height $H_1$ of the structures 104 previously described with reference to FIG. 1A, or at least one of the diameter $D_4$ (or width) and the height $H_3$ of each of the structures 204 may be different than the diameter $D_1$ (or width) and the height $H_1$ of the structures 104. Accordingly, each of the structures 204 may comprise a HAR structure. In addition, a distance $D_5$ between adjacent pairs of the structures 204 may be substantially similar to the distance $D_2$ between adjacent pairs of the structures 104 previously described with reference to FIG. 1A, or the distance $D_5$ between at least one of the structures 204 and at least one other of the structures 204 may be different than the distance $D_2$ between adjacent pairs of the structures 104. The polymer material 232 may be substantially similar to the polymer material 132 previously described with reference to FIG. 1C. Furthermore, the formation of the polymer material 232, and subsequent processing of the semiconductor device structure 200 (e.g., removal of the polymer material 232) may be substantially similar to that described above with reference to FIGS. 1B through 1E, resulting in capacitors 238 including a dielectric material 234, a conductive material 236, and the structures 204, as depicted in FIG. 2B.

In additional embodiments, the methods of the disclosure may be used for the formation and processing of different structures. The different structures may comprise HAR structures, or may comprise non-HAR structures. By way of non-limiting example, the methods of the disclosure may also be used in the formation and processing of various shallow trench isolation (STI) structures, and the formation and processing of various laminant trench structures.

The methods of the disclosure may substantially alleviate adhesion problems (e.g., toppling, collapse, and stiction) related to the formation and processing of components (e.g., HAR structures) of various semiconductor device structures. For example, methods of the disclosure may substantially alleviate adhesion problems related to the formation of the capacitors 138, 238 of the semiconductor device structures 100, 200. The use of the polymer materials 132, 232 of the disclosure may substantially improve a yield of undamaged structures 104, 204 relative to conventional methods of forming such structures 104, 204. The methods of the disclosure advantageously enable the formation of semiconductor device structures (e.g., DRAM structures, NAND structures, MEMS structures, etc.), memory cells, and semiconductor devices exhibiting increased reliability, performance, and durability.

While the disclosure is susceptible to various modifications and alternative forms, specific embodiments have been shown by way of example in the drawings and have been described in detail herein. However, the disclosure is not intended to be limited to the particular forms disclosed.

Rather, the disclosure is to cover all modifications, equivalents, and alternatives falling within the scope of the disclosure as defined by the following appended claims and their legal equivalents.

What is claimed is:

1. A method of forming a semiconductor device, comprising:
    forming conductive structures within openings in a mold template, the conductive structures each individually having an aspect ratio greater than or equal to about 10:1 and comprising a tubular portion integral and continuous with a floor portion;
    selectively removing the mold template through a wet etching process;
    adding a polymer to liquid remaining within spaces between the conductive structures after selectively removing the mold template;
    substantially removing the liquid from the spaces between the conductive structures after adding the polymer thereto to form a porous, solid polymeric material; and
    selectively removing the porous, solid polymeric material from the spaces between the conductive structures.

2. The method of claim 1, further comprising forming a lattice structure over the mold template and laterally adjacent an upper portion of each of the conductive structures prior to selectively removing the mold template, the lattice structure remaining following the removal of the mold template.

3. The method of claim 1, wherein forming the conductive structures comprises forming the tubular portion of each of the conductive structures to have a sidewall thickness within a range of from about 40 Å to about 100 Å.

4. The method of claim 1, wherein forming the conductive structures comprises forming adjacent pairs of the conductive structures to be spaced apart from one another at a distance within a range of from about 200 Å to about 600 Å.

5. The method of claim 1, wherein selectively removing the mold template through a wet etching process comprises exposing the conductive structures and the mold template to an aqueous halogen acid.

6. The method of claim 1, further comprising maintaining the conductive structures submerged in the liquid prior to the adding the polymer to the liquid.

7. The method of claim 1, further comprising selecting the polymer such that void spaces within the porous, solid polymeric material comprise less than or equal to about 40 percent of a total volume of the porous, solid polymeric material.

8. The method of claim 1, wherein substantially removing the liquid from the spaces between the conductive structures after adding the polymer thereto comprises subjecting the liquid and the polymer to a thermal anneal process to remove the liquid and crosslink the polymer.

9. The method of claim 1, wherein selectively removing the porous, solid polymeric material from the spaces between the conductive structures comprises subjecting the porous, solid polymeric material to a reducing plasma comprising one or more of $H_2$ and $NH_3$.

10. The method of claim 1, wherein selectively removing the porous, solid polymeric material from the spaces between the conductive structures comprises exposing the porous, solid polymeric material to a temperature within a range of from about 150° C. to about 750° C. in a reducing atmosphere comprising one or more of $H_2$ and $NH_3$.

11. A method of forming a semiconductor device, comprising:
    forming structures in openings extending through each of a retaining structure and a mold structure underlying the retaining structure, the structures each having an aspect ratio within a range of from about 10:1 to about 100:1 and overlying base semiconductive structure;
    selectively removing the mold structure and cleaning surfaces of the structures by exposing the structures and the mold structure to aqueous halogen acid, followed by tetramethylammonium hydroxide, followed by additional aqueous halogen acid, and followed by one or more of deionized water and isopropyl alcohol;
    forming an aqueous polymeric solution around and between the structures;
    substantially removing water of the aqueous polymeric solution to form a solid polymeric material around and between the structures; and
    selectively removing the solid polymeric material from around and between the structures.

12. The method of claim 11, wherein forming structures over a base semiconductive structure comprises forming stud-shaped structures each individually having a diameter less than or equal to about 250 Å and a height $H_1$ within a range of from about $1.0 \times 10^4$ Å to about $2.0 \times 10^4$ Å.

13. The method of claim 11, wherein forming structures over a base semiconductive structure comprises forming container-shaped structures each individually comprising a floor and one or more sidewalls vertically extending from the floor and laterally circumscribing a void space.

14. The method of claim 11, wherein forming an aqueous polymeric solution around and between the structures comprises:
    maintaining water employed during a wet removal process around and between the structures; and
    dispersing polymer within the maintained water.

15. The method of claim 11, wherein substantially removing water of the aqueous polymeric solution to form a solid polymeric material around and between the structures comprises subjecting the structures and the aqueous polymeric solution to a spin-drying process.

16. The method of claim 11, wherein selectively removing the solid polymeric material from around and between the structures comprises subjecting the solid polymeric material to one or more of a thermal anneal process, high energy radiation, a dry reducing agent, a reducing plasma, and reactive ions.

17. A method of forming of a semiconductor device, comprising:
    forming structures having aspect ratios of greater than or equal to about 10:1 in openings vertically extending through a retaining structure and a mold structure under the retaining structure;
    selectively removing the mold structure relative to the structures and the retaining structure with a wet etchant;
    substantially submerging the structures in one or more of water and isopropyl alcohol after removing the mold structure;
    spin-coating a polymeric solution comprising a water-soluble polymer in a water-miscible solvent over the one or more of the water and the isopropyl alcohol;
    removing remaining portions of the one or more of the water and the isopropyl alcohol to form a porous, solid polymeric material comprising the water-soluble polymer; and
    removing substantially all of the porous, solid polymeric material using one or more of a thermal anneal in a reducing atmosphere and a dry reducing agent.

18. The method of claim 17, further comprising selecting the wet etchant to comprise aqueous hydrofluoric acid.

\* \* \* \* \*